US012740014B2

(12) United States Patent
Yang et al.

(10) Patent No.: US 12,740,014 B2
(45) Date of Patent: Sep. 15, 2026

(54) FLUID IMMERSION COOLING SYSTEM

(71) Applicant: BITMAIN TECHNOLOGIES INC., Beijing (CN)

(72) Inventors: Yinchuang Yang, Beijing (CN); Minghao Li, Beijing (CN); Zhaoxiang Zeng, Beijing (CN); Te Pi, Beijing (CN); Zesen Nie, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 279 days.

(21) Appl. No.: 18/783,198

(22) Filed: Jul. 24, 2024

(65) Prior Publication Data

US 2025/0040090 A1 Jan. 30, 2025

(30) Foreign Application Priority Data

Jul. 24, 2023 (CN) ......................... 202310913116.3

(51) Int. Cl.
*H05K 7/20* (2006.01)

(52) U.S. Cl.
CPC ......... *H05K 7/203* (2013.01); *H05K 7/20318* (2013.01); *H05K 7/20327* (2013.01)

(58) Field of Classification Search
CPC ........... H05K 7/20236; H05K 7/20272; H05K 7/203; H05K 7/20781; H05K 7/20327; H05K 7/20281; H05K 7/2029; H05K 7/20763; H05K 1/0203; H05K 7/208; G06F 1/20; G06F 1/183
See application file for complete search history.

(56) References Cited

U.S. PATENT DOCUMENTS 8,946,889 B2 * 2/2015 Katou .................... H10W 40/00 257/713
10,542,635 B2 * 1/2020 Nishiyama ......... H05K 7/20272
11,006,547 B2 * 5/2021 Gao ........................... G06F 1/20
2012/0320527 A1 * 12/2012 Nishiura ............ G01R 31/2863 361/699
2019/0179382 A1 * 6/2019 Saito ......................... G06F 1/18
(Continued)

FOREIGN PATENT DOCUMENTS

CN 204163796 U 2/2015
CN 113271755 A 8/2021
(Continued)

OTHER PUBLICATIONS

The First Office Action dated Apr. 24, 2025 for Chinese Application No. 202310913116.3.

*Primary Examiner* — Mandeep S Buttar

(57) ABSTRACT

The present application provides a fluid immersion cooling system, including a housing, a circuit board and a partition. There are a plurality of circuit boards, the plurality of circuit boards are spaced apart from each other in an accommodating cavity and are all located at a bottom of the housing, and a side of the circuit board close to the bottom of the housing is provided with a guide hole. There are a plurality of partitions, and one partition is located between two adjacent circuit boards and spaced apart from the corresponding circuit board. Areas between the partitions and the circuit boards, top areas of the partitions and the guide holes together form a continuously bent flow channel for the cooling liquid to flow.

20 Claims, 4 Drawing Sheets

(56) References Cited

U.S. PATENT DOCUMENTS

| | | | | |
|---|---|---|---|---|
| 2020/0323100 | A1* | 10/2020 | Chiu | H05K 7/208 |
| 2023/0068585 | A1* | 3/2023 | Gao | H05K 7/203 |
| 2025/0040090 | A1* | 1/2025 | Yang | H05K 7/20327 |

FOREIGN PATENT DOCUMENTS

| | | | |
|---|---|---|---|
| CN | 114006103 | A | 2/2022 |
| CN | 114828548 | A | 7/2022 |
| CN | 116315268 | A | 6/2023 |
| CN | 220235305 | U | 12/2023 |

* cited by examiner

FLUID IMMERSION COOLING SYSTEM

CROSS-REFERENCE TO RELATED APPLICATION

This application claims priority to Chinese Patent Application No. 202310913116.3, filed on Jul. 24, 2023, which is hereby incorporated by reference in its entirety.

TECHNICAL FIELD

The present application relates to the technical field of electronic apparatus cooling, and specifically relates to a fluid immersion cooling system.

BACKGROUND

Electronic systems, such as information technology apparatus (for example, computers, routers, packet switches, cellular circuits), generate heat during operation. A fluid immersion cooling system is to immerse the electronic system in cooling liquid, where a dual-phase fluid immersion cooling system is included.

In the dual-phase fluid immersion cooling system, heat energy generated by the electronic system converts the cooling liquid into vapor, the vapor is collected by a condensing structure after rising, the condensing structure converts the vapor into liquid, and the liquid falls back into the cooling liquid to complete a cooling cycle.

However, the above-mentioned fluid immersion cooling system has a poor cooling effect and affects the use of a user.

SUMMARY

In order to solve at least one problem mentioned in the background, the present application provides a fluid immersion cooling system, which is intended to solve a technical problem that a cooling effect of the fluid immersion cooling system in the related art is poor, affecting the use of a user.

In order to achieve the above objective, the present application provides a fluid immersion cooling system, including a housing, a circuit board and a partition, where the housing has an accommodating cavity, and the accommodating cavity is configured for accommodating cooling liquid; there are a plurality of circuit boards, the plurality of circuit boards are spaced apart from each other in the accommodating cavity and are all located at a bottom of the housing, and a side of the circuit board close to the bottom of the housing is provided with a guide hole; there are a plurality of partitions, and one partition is located between two adjacent circuit boards and spaced apart from the corresponding circuit board;

areas between the partitions and the circuit boards, top areas of the partitions and the guide holes together form a continuously bent flow channel for the cooling liquid to flow.

In the above-mentioned fluid immersion cooling system, in an implementation, a chip is provided on the circuit board, a surface on which the chip is provided on the circuit board is a front surface, a surface on which the chip is not provided is a back surface, and a distance between the front surface and a corresponding partition is greater than a distance between the back surface and a corresponding partition.

In the above-mentioned fluid immersion cooling system, in an implementation, the distance between the front surface and the corresponding partition is A, the distance between the back surface and the corresponding partition is B, and a relationship between A and B is:

$$\frac{A}{B} \geq 4,\ A \geq 4 \text{ mm}.$$

In the above-mentioned fluid immersion cooling system, in an implementation, one circuit board is provided with a plurality of chips, and the plurality of chips are spaced apart from each other in an array on the circuit board;

the fluid immersion cooling system further includes a heat conducting member, and there are a plurality of heat conducting members; the plurality of heat conducting members correspond to the plurality of chips and are provided on a side of the corresponding chips away from the circuit board.

In the above-mentioned fluid immersion cooling system, in an implementation, the heat conducting member includes a metal member or graphite, and the heat conducting member at least covers a part of the corresponding chip.

In the above-mentioned fluid immersion cooling system, in an implementation, a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

In the above-mentioned fluid immersion cooling system, in an implementation, in a direction perpendicular to an extending direction of the circuit board, an orthographic projection of the partition on the housing at least covers an orthographic projection of the circuit board on the housing.

In the above-mentioned fluid immersion cooling system, in an implementation, there are a plurality of guide holes, and the plurality of guide holes are spaced apart from each other in an array on the circuit board.

In the above-mentioned fluid immersion cooling system, in an implementation, the fluid immersion cooling system further includes an internal condenser tube and an external condenser tube which are communicated with each other; the internal condenser tube is located in the accommodating cavity and is arranged close to a top of the housing; the external condenser tube is located outside the housing and is communicated with the internal condenser tube.

In the above-mentioned fluid immersion cooling system, in an implementation, there are a plurality of internal condenser tubes, the plurality of internal condenser tubes are spaced apart from each other in parallel, and the plurality of internal condenser tubes are all in communication with the external condenser tube.

The fluid immersion cooling system provided by the present application, including a housing, a circuit board and a partition, where the housing has an accommodating cavity, and the accommodating cavity is configured for accommodating cooling liquid. The cooling liquid is configured for cooling the circuit board and performing convection heat exchange with the circuit board, and a part of the cooling liquid is vaporized during this process. There are a plurality of circuit boards, the plurality of circuit boards are spaced apart from each other in the accommodating cavity and are all located at a bottom of the housing, and a side of the circuit board close to the bottom of the housing is provided with a guide hole. By providing the above-mentioned guide hole, the cooling liquid can flow from one side of the circuit board to the other side. There are a plurality of partitions, and one partition is located between two adjacent circuit boards and spaced apart from the corresponding circuit board. By providing the above-mentioned partitions, a space between adjacent circuit boards is reduced, a flow area of the cooling liquid is reduced, and a flow speed is increased. Areas between the partitions and the circuit boards, top areas of the partitions and the guide holes together form a continuously bent flow channel for the cooling liquid to flow. Through the above-mentioned arrangement, the flow channel is made to be a continuously bent structure, a flow direction of the cooling liquid on a chip side in the accommodating cavity is the same as a flow direction of bubbles generated by vaporization. Both the generation of bubbles and the process of being away from the bottom of the housing under the action of gravity, form a low-pressure area compared with the cooling liquid which keeps flowing, resulting in a pressure difference. Further, under the action of the pressure difference, the flow speed of the cooling liquid is increased, so that the cooling efficiency of the fluid immersion cooling system can be improved. Meanwhile, an accelerated flow of the cooling liquid drives bubbles to flow, so that the flow speed of the bubbles can be improved, thereby improving the cooling efficiency of the fluid immersion cooling system.

The structure of the present application, as well as other objectives and beneficial effects thereof, would be more apparent by referring to the accompanying drawings and the description of the embodiments.

BRIEF DESCRIPTION OF DRAWINGS

In order to illustrate the technical solutions in the embodiments of the present application or in the prior art more clearly, the following briefly introduces the accompanying drawings required for describing the embodiments or the prior art. Apparently, the accompanying drawings in the following description are some embodiments of the present application, and for those skilled in the art, other drawings may also be obtained according to these drawings without creative efforts.

DESCRIPTION OF THE REFERENCE NUMBERS

Figure 1:
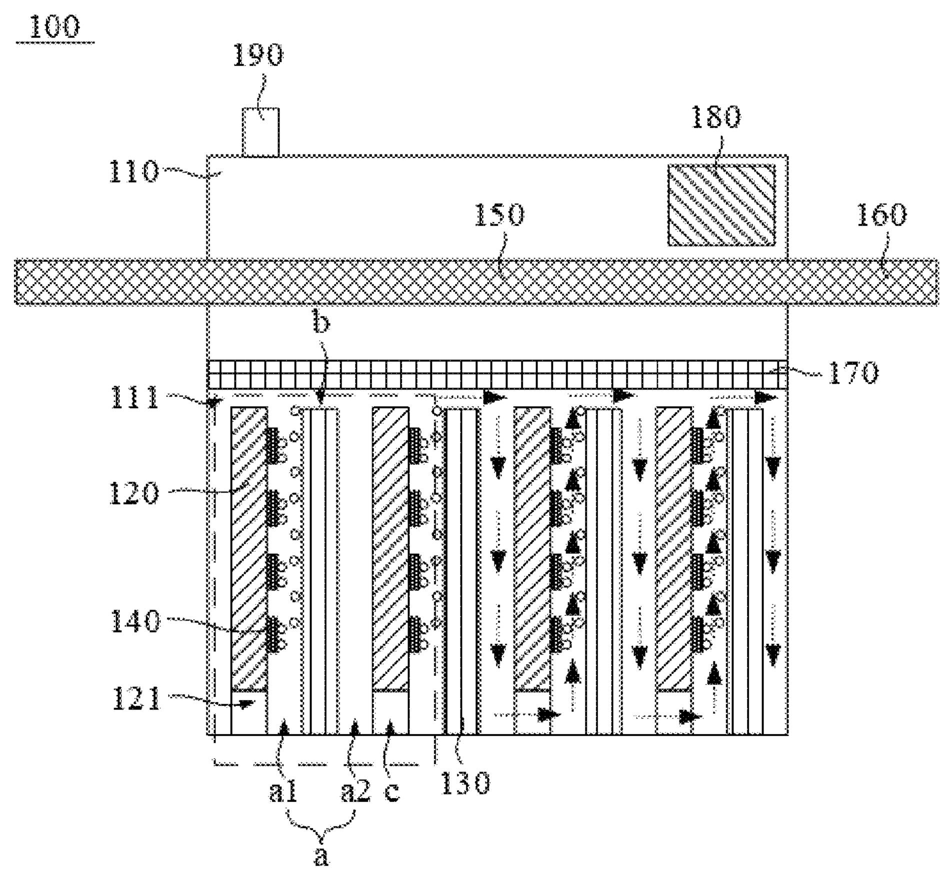
FIG. 1 is a structural schematic diagram of a fluid immersion cooling system provided by an embodiment of the present application.

100—fluid immersion cooling system;
110—housing;
120—circuit board;
130—partition;
111—accommodating cavity;
121—guide hole;
140—heat conducting member;
150—internal condenser tube;
160—external condenser tube;
170—sealing member;
180—drying member;
190—vacuum plug.

Through the above-mentioned accompanying drawings, specific embodiments of the present application have been illustrated, which would be described in more detail in the following. These accompanying drawings and text descriptions are not intended to limit the scope of the concept of the present application in any way, but to explain the concepts of the present application for those skilled in the art by referring to specific embodiments.

DESCRIPTION OF EMBODIMENTS

In the related art, a plurality of circuit boards are provided in a housing, both sides of the circuit boards are spaced apart from the housing, and cooling liquid flows among the plurality of circuit boards. In the flow process of the cooling liquid, a part of the cooling liquid flows through a gap between the top of the housing and the circuit board, and the other part of the cooling liquid flows through a gap between the bottom of the housing and the circuit board, the cooling liquid flows in opposite directions, and a collision may occur. In addition, convection heat exchange occurs between the circuit boards and the cooling liquid, a part of the cooling liquid is vaporized, and the generated bubbles flow along a direction away from the ground and opposite to a direction in which a part of cooling liquid flows, and then a collision occurs, affecting the flow of the cooling liquid and the bubbles, and further affecting the cooling effect of the fluid immersion cooling system.

Based on the above-mentioned technical problems, the present application provides a fluid immersion cooling system, including a housing, a circuit board and a partition. The housing has an accommodating cavity, the accommodating cavity is configured for accommodating cooling liquid, the cooling liquid is configured for cooling the circuit board and performing convection heat exchange with the circuit board, and a part of the cooling liquid is vaporized during this process. There are a plurality of circuit boards, the plurality of circuit boards are spaced apart from each other in the accommodating cavity and are all located at a bottom of the housing. A side of the circuit board close to the bottom of the housing is provided with a guide hole, and by providing the above-mentioned guide hole, the cooling liquid can flow from one side of the circuit board to the other side. There are a plurality of partitions, and one partition is located between two adjacent circuit boards and spaced apart from the corresponding circuit board. By providing the above-mentioned partitions, a space between adjacent circuit boards is reduced, a flow area of the cooling liquid is reduced, and a flow speed is increased. Areas between the partitions and the circuit boards, top areas of the partitions and the guide holes together form a continuously bent flow channel for the cooling liquid to flow. Through the above-mentioned arrangement, the flow channel is made to be a continuously bent structure, a flow direction of the cooling liquid on a chip side in the accommodating cavity is the same as a flow direction of bubbles generated by vaporization. Both the generation of bubbles and the process of being away from the bottom of the housing under the action of gravity, form a low-pressure area compared with the cooling liquid which keeps flowing, resulting in a pressure difference. Further, under the action of the pressure difference, the flow speed of the cooling liquid is increased, so that the cooling efficiency of the fluid immersion cooling system can be improved. Meanwhile, an accelerated flow of the cooling liquid drives bubbles to flow, so that the flow speed of the bubbles can be improved, thereby improving the cooling efficiency of the fluid immersion cooling system.

In order to make the objectives, technical solutions, and advantages of the present application clearer, the following describes the technical solutions in the embodiments of the present application in more detail with reference to the accompanying drawings in embodiments of the present application. In the accompanying drawings, the same or similar reference numbers indicate the same or similar structural members or structural members with the same or similar functions throughout. The described embodiments are merely a part rather than all of the structural embodiments of the present application. The embodiments described below with reference to the accompanying drawings are exemplary, and are intended to explain the present application, but not to be interpreted as limitations of the present application. Based on the embodiments of the present application, all other embodiments obtained by persons of ordinary skill in the art without creative efforts shall belong to the scope of protection of the present application. The embodiments of the present application would be described below in detail with reference to the accompanying drawings.

In order to achieve the above-mentioned objectives, referring to FIG. 1, the present application provides a fluid immersion cooling system 100, including a housing 110, a circuit board 120 and a partition 130.

Specifically, referring to FIG. 1, the housing 110 has an accommodating cavity 111, the accommodating cavity 111 is configured for accommodating cooling liquid, the cooling liquid is configured for cooling the circuit board 120 and performing convection heat exchange with the circuit board 120, and a part of the cooling liquid is vaporized during this process. Exemplarily, the cooling liquid may include water, may also include mineral oil, and may also include fluorinated liquid. The embodiments of the present application do not limit the specific form of the cooling liquid, and are not limited to the above-mentioned examples.

In the following, the cooling liquid including fluorinated liquid is taken as an example to explain. A boiling point range of the fluorinated liquid may be 30-80° C., so as to facilitate convection heat exchange to the circuit board 120. The fluorinated liquid may be one or more of HFE (Hydrofluoroether)-7000, HFE-7100, FC (Fluorocarbon)-3284, FC-72, FCM (Fluorinated Carbon Molecules)-47 and Noah®2000.

It should be noted that the housing 110 has a certain pressure-bearing capacity, and has a certain thickness, so as to bear the flow of the cooling liquid. In some embodiments, the housing 110 may bear a pressure of 0.1 MPa. Exemplarily, a preparation material of the housing 110 may be an aluminum alloy, may also be a copper or a copper alloy, may also be a metal such as stainless steel, may also be an acrylic plate, or the like.

The thickness range of the housing 110 may be 4-6 mm. Exemplarily, the thickness of the housing 110 may be 4 mm, may also be 5 mm, may also be 6 mm, or the like. The embodiments of the present application do not limit the specific thickness of the housing 110, and are not limited to the above-mentioned examples.

In the following, an example that the preparation material of the housing 110 includes a 3003 aluminum alloy and the thickness of the housing 110 is 5 mm, is taken to explain.

Specifically, referring to FIG. 1, there are a plurality of circuit boards 120, and the plurality of circuit boards 120 are spaced apart from each other in the accommodating cavity 111 and are all located at the bottom of the housing 110. A side of the circuit board 120 close to the bottom of the housing 110 is provided with a guide hole 121. The guide hole 121 may be configured for conducting the cooling liquid, so that the cooling liquid may flow from one side of the circuit board 120 to the other side to form a mutually communicated flow channel, so as to facilitate the backflow of the cooling liquid.

The circuit board 120 may include an FR-4 glass fiber cloth substrate, may also include a composite substrate of CEM (Composite Epoxy Material)—⅓ glass fiber and paper, may also include an FR-1 paper-based copper-coated board, and may also include a metal-based copper-coated board, or the like. The embodiments of the present application do not limit the specific form of the circuit board 120, and are not limited to the above-mentioned examples.

In the following, the circuit board 120 including FR-4 epoxy glass fiber cloth substrate is taken as an example to explain.

Specifically, referring to FIG. 1, there are a plurality of partitions 130, and one partition 130 is located between two adjacent circuit boards 120 and spaced apart from the corresponding circuit board 120, so that the cooling liquid can flow in an area between the circuit board 120 and the partition 130.

It should be noted that, the partition 130 does not have conductivity, thereby preventing the circuit board 120 from contacting the partition 130 and affecting the normal use of the circuit board 120. In addition, there is a corresponding relationship between the partition 130 and the cooling liquid. Exemplarily, when the cooling liquid is fluorinated liquid, a preparation material of the partition 130 may be a resin compatible with the fluorinated liquid, and may also be an acrylic plate. The embodiments of the present application do not limit the preparation material of the partition 130, and are not limited to the above-mentioned examples.

It should be understood that, by providing the above-mentioned partition 130 between adjacent circuit boards 120, the space between adjacent circuit boards 120 is reduced, and further, the flow area of the cooling liquid is reduced, and under the condition that the inflow condition of the cooling liquid is unchanged, the flow speed of the cooling liquid can be increased, and then the time required for the cooling liquid to complete the backflow is shortened, and further the cooling efficiency of the fluid immersion cooling system 100 can be improved.

Further, the areas between the partitions 130 and the circuit boards 120, the top areas of the partitions 130 and the guide holes 121 together form a continuously bent flow channel for the cooling liquid to flow. It should be noted that, the top areas of the partitions 130 may refer to that the top of the partition 130 is provided with a through hole, and may also refer to that there is a gap between the partition 130 and the top of the housing 110.

Referring to FIG. 1, the area between the partition 130 and the circuit board 120 is area a, the top area of the partition 130 is area b, and the area where the guide hole 121 is configured for conducting is area c. During the flow of the cooling liquid, the cooling liquid starts to flow from the area between the circuit board 120 and a side of the housing 110, and enters the area a through the guide hole 121 (that is, the area c). In the area a, the cooling liquid flows from the bottom of the housing 110 to the top of the housing 110, at this time, the bubbles generated by the vaporization of the cooling liquid also flow to the top of the housing 110 (it should be noted that the bubbles generated by the vaporization of the cooling liquid are cooling liquid gas, that is, the bubbles are gaseous cooling fluid, the cooling fluid is liquid bubble, and the difference merely lies in the change of state). The flow direction of the cooling fluid on the chip side in the accommodating cavity 111 is the same as the flow direction of bubbles generated by vaporization, and the flow speed of the bubbles is less affected by the cooling liquid, so as to facilitate to improve the cooling efficiency of the fluid immersion cooling system 100. Meanwhile, the flow of the cooling liquid is less affected by the bubbles, and the flow speed is increased, thereby improving the cooling efficiency of the fluid immersion cooling system 100.

Further, the cooling liquid flows from area a to area b, flows to another area a through area b, then enters another area a through area c, and continues the above-mentioned flow process. It should be understood that, the flow directions of the cooling liquid in two adjacent areas a are opposite, and the flow direction in area b is the same as that in area c, so that the cooling liquid may form the continuously bent flow channel in the accommodating cavity 111. By forming the above-mentioned flow channel of the cooling liquid, on the one hand, collisions between the cooling liquid and the bubbles can be reduced, and on the other hand, the flow speed of the cooling liquid in the accommodating cavity 111 can be increased, so as to improve the cooling efficiency of the fluid immersion cooling system 100.

It should be noted that, through the above-mentioned arrangement, the flow speed of the cooling liquid in the accommodating cavity 111 may be increased, and the flow speed of the bubbles is increased. Compared with a solution without the above-mentioned arrangement, the heat that can be cooled in unit time by the fluid immersion cooling system 100 in the embodiment of the present application is increased, that is, a heat flux density (Heat Flux) is increased, and a heat dissipation requirement of an electronic device with high heat flux density (for example, a CPU (Central Processing Unit, CPU) which generates relatively large power consumption) may be satisfied, and the user requirements are satisfied.

As an implementation, a chip (not shown in the figures) is provided on the circuit board 120, a surface on which the chip is provided on the circuit board 120 is a front surface, a surface on which the chip is not provided is a back surface, and a distance between the front surface and the corresponding partition 130 is greater than a distance between the back surface and the corresponding partition 130.

It should be understood that the chip provided on the circuit board 120 may generate heat during a working process, and during this process, the cooling liquid may also perform convection heat exchange with the chip, thereby reducing the temperature of the chip and ensuring the normal working of the chip.

It should be noted that each circuit board 120 has a front surface and a back surface, and the position of the front surface with respect to the circuit board 120 is the same, that is, the front surface of each circuit board 120 faces one side of the corresponding circuit board 120, and then when the chip located on the front surface is in a working state, bubbles generated by convection heat exchange between the cooling liquid, the chip and the circuit board 120 are all located on one side of the corresponding circuit board 120, that is, the side where the front surface is located. In this way, the bubbles correspondingly generated by adjacent circuit boards 120 and chips do not interfere with each other, affecting the flow of the bubbles.

It should be understood that, the surface on which the chip is provided on the circuit board 120 is the front surface, and the surface of the circuit board 120 opposite to the front surface is the back surface. Further, the partition 130 is provided between two adjacent circuit boards 120, that is, two sides of the partition 130 respectively correspond to the front surface of one circuit board 120 and the back surface of another circuit board 120, referring to FIG. 1, that is, area a includes area a1 and area a2. An area between the partition 130 and the front surface of the circuit board 120 is area a1, and an area between the partition 130 and the back surface of the circuit board 120 is area a2.

It should be understood that, in the flow process of the cooling liquid, the cooling liquid starts to flow from the area between the circuit board 120 and the side of the housing 110, and enters area a1 from area c. In area a1, the cooling liquid flows from the bottom of the housing 110 to the top of the housing 110, at this time, the bubbles generated by the vaporization of the cooling liquid also flow to the top of the housing 110. Then the cooling liquid flows from area a1 to area b, and flows from area b to area a2. In area a2, the cooling liquid flows from the top of the housing 110 to the bottom of the housing 110, close to the guide hole 121, and flows from area a2 to another area a1 through the guide hole 121, so that the cooling liquid may form the continuously bent flow channel in the accommodating cavity 111. By forming the above-mentioned flow channel of the cooling liquid, on the one hand, collisions between the cooling liquid and the bubbles can be reduced, and on the other hand, the flow speed of the cooling liquid in the accommodating cavity 111 can be increased, so as to improve the cooling efficiency of the fluid immersion cooling system 100.

Figure 2:
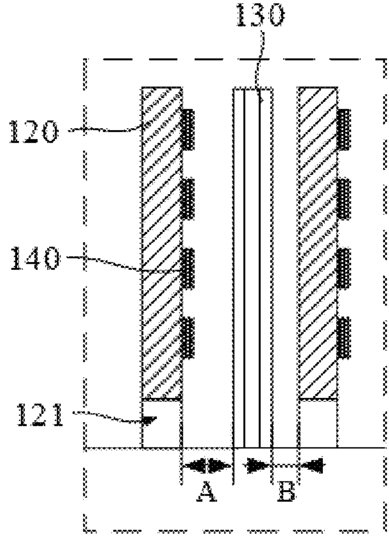
FIG. 2 is an enlarged structural schematic diagram of a rectangular dashed box in FIG. 1.

As an implementation, referring to FIG. 1 and FIG. 2, a distance between the front surface and the corresponding partition 130 is A, and a distance between the back surface and the corresponding partition 130 is B. A relationship between A and B is:

$$\frac{A}{B} \geq 4,\ A \geq 4\ \text{mm}.$$

By setting A to be greater than B, that is, the distance between the front surface and the corresponding partition 130 is greater than the distance between the back surface and the corresponding partition 130, to satisfy the requirement of the cooling liquid and bubbles simultaneously flowing in area a1, and to provide sufficient space for the flow of the cooling liquid and the flow of the bubbles, so as to improve the cooling efficiency of the fluid immersion cooling system 100.

It should be understood that the values of A and B may be arbitrary. Exemplarily, A may be 4 mm, 5 mm, 6 mm, 7 mm, 8 mm, and the like. Correspondingly, B may be 0.5 mm, 0.6 mm, 0.7 mm, 0.8 mm, 0.9 mm, 1 mm, 2 mm, and the like. The embodiments of the present application do not limit the specific numerical values of A and B, and are not limited to the above-mentioned examples, as long as the above-mentioned relationships are satisfied.

It should be noted that, as many circuit boards 120 as possible may be installed in the same housing 110, so as to improve the utilization rate of the cooling liquid while satisfying the cooling requirement of the circuit boards 120.

As an implementation, the front surface and a bottom surface of the housing 110 are arranged in an intersecting manner. For example, an angle range between the front surface and the bottom surface of the housing 110 may be 90 degrees to 120 degrees, that is, an angle between the front surface and the bottom surface of the housing 110 is a right angle or a small obtuse angle, so that bubbles may flow along a direction from the bottom of the housing 110 towards the top of the housing 110.

It should be noted that, when the angle between the front surface and the bottom surface of the housing 110 is the small obtuse angle, the space between the chip and the circuit board 120 which are close to the top of the housing 110 and the corresponding partition 130 is relatively large, so as to facilitate the generation and flow of bubbles, and the critical heat flux density (Critical Heat Flux) between the surface of the chip and the surface of the circuit board 120 may be increased, so as to improve the cooling efficiency of the fluid immersion cooling system 100. In addition, when the angle between the front surface and the bottom surface of the housing 110 is the small obtuse angle, the front surface of the circuit board 120 faces upwards, so that it would not cause the bubbles difficultly separating due to downwards, thereby reaching the critical heat flux density, causing the temperature of the chip to exceed a critical value, and affecting the normal operation of the chip.

As an implementation, one circuit board 120 is provided with a plurality of chips (not shown in the figures), and the plurality of chips are spaced apart from each other in an array on the circuit board 120, so as to avoid collision between adjacent chips which affecting the generation of bubbles, and further affecting the normal operation of the chips.

It should be noted that, in a direction perpendicular to a thickness of the circuit board 120, the cross-sectional shape of the circuit board 120 may be arbitrary. Exemplarily, the cross-sectional shape of the circuit board 120 may be a rectangle, may be a square, may be a circle, may be a triangle, may be a polygon, or the like. The embodiments of the present application do not limit the specific shape of the circuit board 120, and are not limited to the above-mentioned examples.

In order to reduce the time required for the bubbles to flow to the top of the housing 110, the cross-sectional shape of the circuit board 120 may be a rectangle or a rhombus or an ellipse with a height less than a width, and correspondingly, the specific arrangement of the plurality of chips on the circuit board 120 may also be different. Exemplarily, the chips may be arranged in a 12-rows×18-columns arrangement manner, may also be arranged in a 14-rows×16-columns arrangement manner, and may also be arranged in a 10-rows×14-columns arrangement manner, and the like.

The embodiments of the present application do not limited the specific number of the chips and the specific arrangement manner of the plurality of chips on the circuit board 120, and are not limited to the above-mentioned examples.

In the following, the chips provided on the circuit board 120 in the 12-rows×18-columns arrangement manner are taken as an example to explain.

Figure 3:
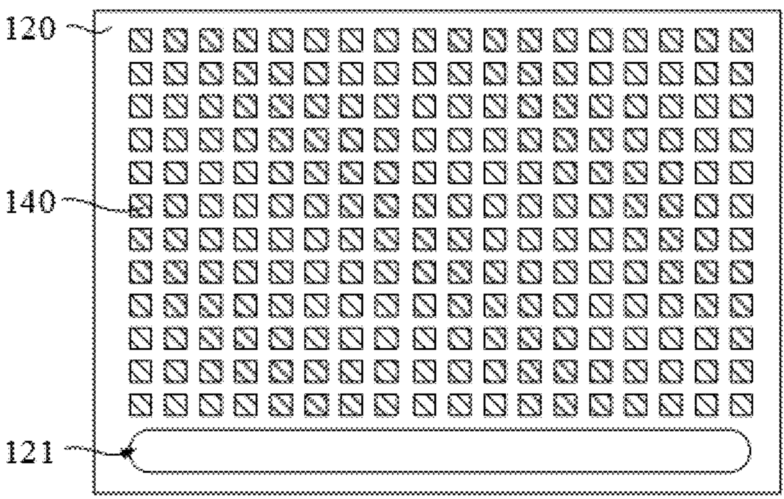
FIG. 3 is a structural schematic diagram of a circuit board from another perspective of a fluid immersion cooling system provided by an embodiment of the present application.
Figure 4:
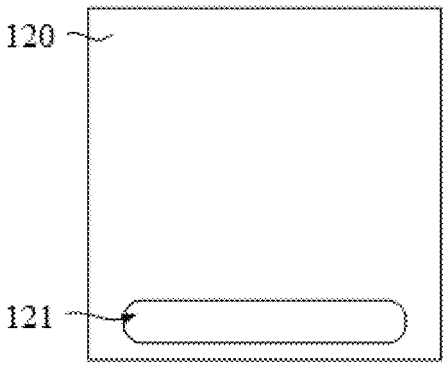
FIG. 4 is a first structural schematic diagram of a circuit board of a fluid immersion cooling system provided by an embodiment of the present application.

As an implementation, referring to FIG. 1 to FIG. 3, the fluid immersion cooling system 100 further includes a heat conducting member 140. There are a plurality of heat conducting members 140, the plurality of heat conducting members 140 correspond to the plurality of chips and are provided on a side of the corresponding chips away from the circuit board 120. The heat conducting member 140 may increase the number of bubbles nucleation on the chip surface. The arrangement of the heat conducting members 140 may be the same as the arrangement of the chips. Compared with the chip without the heat conducting member 140, for the chip with the heat conducting member 140, the number of bubble nucleation is increased at the same time, that is, the speed of convection heat exchange between the cooling liquid and the chip is increased, which can increase the critical heat flux density and increase a convective heat transfer coefficient (Convective Heat Transfer Coefficient), so as to improve the cooling efficiency of the fluid immersion cooling system 100.

It should be noted that one heat conducting member 140 may correspond to one chip, that is, the plurality of heat conducting members 140 correspond to the plurality of chips one-by-one. One heat conducting member 140 may also correspond to the plurality of chips. Exemplarily, one heat conducting member 140 may correspond to two chips, may also correspond to three chips, and may also correspond to four chips. The embodiments of the present application do not limit the number of chips to which one heat conducting member 140 may correspond, and are not limited to the above-mentioned examples.

Further, when one heat conducting member 140 corresponds to the plurality of chips, the plurality of chips may be spaced apart from each other in columns, may also be spaced apart from each other in rows, may also be spaced apart from each other in arrays, and may also be other arrangement. The embodiments of the present application do not limit the arrangement manner of some chips to which one heat conducting member 140 corresponds, and are not limited to the above-mentioned examples.

As an implementation, the heat conducting member 140 includes a metal member or graphite.

Exemplarily, when the heat conducting member 140 includes the metal member, the form of the metal member may be arbitrary. Exemplarily, the metal member may be a block-shaped metal member, may also be a foam-shaped metal member, may also be a mesh-shaped metal member, and may also be metal columns arranged in an array. Further, a preparation material of the metal member may be a copper, and may also be other metal materials with thermal conductivity. When the heat conducting member 140 includes the graphite, the heat conducting member 140 may include porous graphite. The embodiments of the present application do not limit the specific form of the heat conducting member 140, and are not limited to the above-mentioned examples.

In the following, the heat conducting member 140 being a copper block is taken as an example to explain. Specifically, the copper block may be formed in a copper powder spraying manner, so that a surface roughness of the chip may be increased, thereby increasing the number of vaporization nucleation of the chip surface.

Further, the heat conducting member 140 covers at least a part of the corresponding chip, that is, the heat conducting member 140 may cover a part of the corresponding chip, and may also cover the whole of the corresponding chip, so as to contact the chip. In the embodiments of the present application, in order to ensure that the heat conducting member 140 can better increase the number of vaporization nucleation generated by the chips, and to better position the installing position of the heat conducting member 140, the heat conducting member 140 may cover the whole of the corresponding chip, that is, the size of the heat conducting member 140 is the same as the size of the corresponding chip.

As an implementation, referring to FIG. 1, a side of the partition 130 away from the bottom of the housing 110 is spaced apart from an inner wall of the top of the housing 110 to form the area b. The area b may at least communicate with two adjacent areas a, that is, the area b at least communicates with adjacent area a1 and area a2 to form the communicated flow channel.

The side of the circuit board 120 away from the bottom of the housing 110 is spaced apart from the inner wall of the top of the housing 110, that is, there is a gap between the circuit board 120 and the inner wall of the top of the housing 110, which can be used for the bubbles to flow. Or, the side of the circuit board 120 away from the bottom of the housing 110 is closely arranged with the inner wall of the top of the housing 110, that is, there is no gap between the circuit board 120 and the inner wall of the top of the housing 110, which can ensure that the cooling liquid does not pass through the area between the circuit board 120 and the top of the housing 110 and collide with the flow of the bubbles.

It should be noted that, in the above-mentioned arrangement, bubbles are generated on the front surface of the circuit board 120, so that a pressure difference is formed between the front surface and the back surface of the plurality of circuit boards 120. The cooling liquid flows to the front surface through the back surface under the action of the pressure difference. In addition, because bubbles may be generated in area a1, under the action of the pressure difference, the cooling liquid may flow from the back surface to the front surface through the guide holes 121, and then the cooling liquid may flow among the plurality of circuit boards 120 and the plurality of partitions 130.

As an implementation, in a direction perpendicular to an extending direction of the circuit board 120, an orthographic projection of the partition 130 on the housing 110 at least covers an orthographic projection of the circuit board 120 on the housing 110. That is, the size of the partition 130 may be the same as the size of the circuit board 120, and may also be greater than the size of the circuit board 120. In the embodiments of the present application, the size of the partition 130 may be the same as the size of the circuit board 120, that is, the orthographic projection of the partition 130 on the housing 110 may cover each other with the orthographic projection of the circuit board 120 on the housing 110.

It should be noted that, a thickness range of the partition 130 may be 1-3 mm. Exemplarily, a thickness of the partition 130 may be 1 mm, 2 mm, 3 mm, and the like. The embodiments of the present application do not limit the specific thickness of the partition 130, and are not limited to the above-mentioned examples.

In the following, an example that the thickness of the partition 130 is 3 mm, is taken to explain.

As an implementation, referring to FIG. 1, a side of the circuit board 120 close to the bottom of the housing 110 may abut against the housing 110, so as to facilitate to install the circuit board 120 and improve the installation stability of the circuit board 120. In this case, referring to FIG. 4 to FIG. 7, the guide hole 121 may be opened at the side of the circuit board 120 close to the bottom of the housing 110, and the cooling liquid may flow through the guide hole 121.

It should be noted that, referring to FIG. 4 to FIG. 7, all the shape, the size and the number of the guide holes 121 may be arbitrary. Exemplarily, a cross-sectional shape of the guide hole 121 in a direction perpendicular to the thickness of the circuit board 120 may be a rectangle, may also be a circle, may also be a rectangle with round corners or a triangle, or the like.

Figure 5:
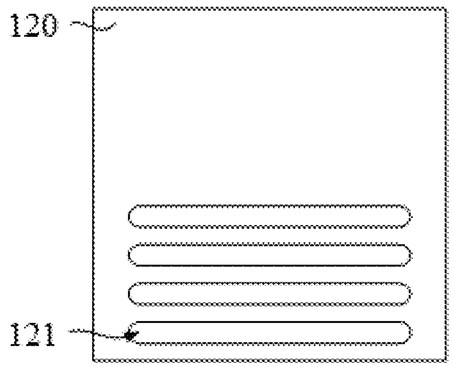
FIG. 5 is a second structural schematic diagram of a circuit board of a fluid immersion cooling system provided by an embodiment of the present application.
Figure 6:
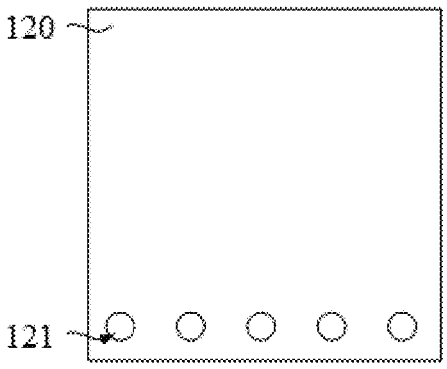
FIG. 6 is a third structural schematic diagram of a circuit board of a fluid immersion cooling system provided by an embodiment of the present application.
Figure 7:
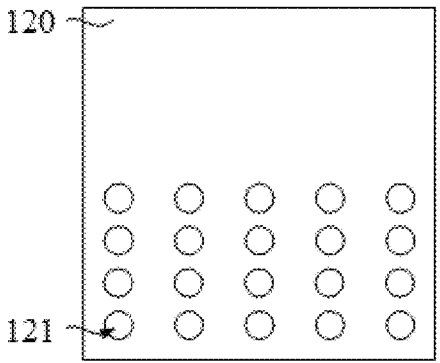
FIG. 7 is a fourth structural schematic diagram of a circuit board of a fluid immersion cooling system provided by an embodiment of the present application.

As an implementation, referring to FIG. 5 to FIG. 7, there are a plurality of guide holes 121, and the plurality of guide holes 121 are spaced apart from each other in an array on the circuit board 120. The number of guide holes 121 may be two, three, four, five, and may also be ten, twenty, thirty, or the like. The size of the guide hole 121 may be related to wiring on the circuit board 120, and may also be related to the number of the guide holes 121. For example, when there is a small number of wiring on the circuit board 120, the guide hole 121 may be set to a relatively large size, so as to facilitate the cooling liquid to flow. When there is a large number of wiring on the circuit board 120, the guide hole 121 may be set to a relatively small size, so as to avoid affecting the normal operation of the circuit board 120. Further, when the guide hole 121 is set to a relatively large size, the number of the guide holes 121 is relatively small. When the guide holes 121 is set to a relatively small size, the number of guide holes 121 is relatively large.

As an implementation, referring to FIG. 1 and FIG. 8 to FIG. 10, the fluid immersion cooling system 100 further includes an internal condenser tube 150 and an external condenser tube 160 which are communicated with each other. The internal condenser tube 150 is located in the accommodating cavity 111 and is arranged close to the top of the housing 110, and the external condenser tube 160 is located outside the housing 110 and is communicated with the internal condenser tube 150. The internal condenser tube 150 is configured to condense a cooling liquid gas, that is, the cooling liquid performs convection heat exchange with the chips or the circuit boards 120, and generates a gaseous cooling liquid. The internal condenser tube 150 is in contact with the cooling liquid gas, and the gas is condensed and converted into the cooling liquid, so that liquid-gaseous-liquid state switching of the cooling liquid is achieved, and working medium circulation may be achieved. The external condenser tube 160 is in communication with the internal condenser tube 150, and may form a condensing pipeline mutually communicating with the internal condenser tube 150. During the process of condensing the cooling liquid gas by the internal condenser tube 150, a cooling liquid in the internal condenser tube 150 is lost, by providing the external condenser tube 160, the cooling liquid in the internal condenser tube 150 may be replenished, so as to maintain a circulation of a condensing medium in the internal condenser tube 150 and maintain the contact between the internal condenser tube 150 and the cooling liquid gas.

It should be understood that, convection heat exchange between the cooling liquid and the chips, or between the cooling liquid and the circuit boards 120 may cause a partial loss, and the cooling liquid generated by condensation of the generated cooling liquid gas may replenish the partial loss, thereby reducing the replenishment of the cooling liquid, reducing the number of times of adjusting the fluid immersion cooling system 100 by the user, and improving the user experience. In addition, the above-mentioned working medium circulation may enhance the generation of the cooling liquid gas, so as to increase the critical heat flux density, improve the convective heat transfer coefficient, and further improve the cooling efficiency of the fluid immersion cooling system 100.

It should be noted that, the internal condenser tube 150 and the external condenser tube 160 may be integrally formed, and a medium flowing in the internal condenser tube 150 may be the same as a medium flowing in the external condenser tube 160. Exemplarily, the medium flowing in the internal condenser tube 150 and the external condenser tube 160 may be water, and may also be ethylene glycol.

In the following, an example that the internal condenser tube 150 and the external condenser tube 160 are integrally formed, is taken to explain.

It should be understood that, referring to FIG. 1, a sealing member 170 may be provided between the internal condenser tube 150 and the circuit board 120, that is, the accommodating cavity 111 is divided into two cavities by the sealing member 170. The sealing member 170 may have a through hole, so that the cooling liquid gas contacts with the internal condenser tube 150 through the through hole, thereby implementing the condensation of the cooling liquid gas.

It should be noted that the forms of the internal condenser tube 150 and the external condenser tube 160 may be arbitrary. Exemplarily, both the internal condenser tube 150 and the external condenser tube 160 may be metal tubes with a high heat exchange rate. Further, both the internal condenser tube 150 and the external condenser tube 160 may be metal tubes with smooth surfaces, may also be outer ribbed tubes, may also be zigzag tubes, and may also be zigzag low ribbed tubes or double-sided reinforced tubes. The embodiments of the present application do not limit the specific forms of the internal condenser tube 150 and the external condenser tube 160, and are not limited to the above-mentioned examples.

In the following, an example that both the internal condenser tube 150 and the external condenser tube 160 are zigzag tubes, is taken to explain.

Figure 8:
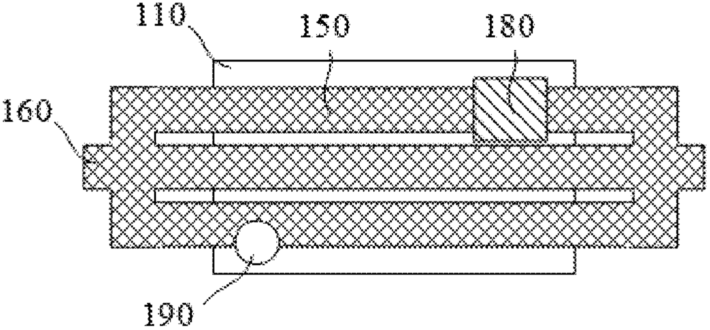
FIG. 8 is a first structural schematic diagram from another perspective of a fluid immersion cooling system provided by an embodiment of the present application.

As an implementation, referring to FIG. 1 and FIG. 8, there are a plurality of internal condenser tubes 150, the plurality of internal condenser tubes 150 are spaced apart from each other in parallel, and all of the plurality of internal condenser tubes 150 are in communication with the external condenser tube 160. By providing the above-mentioned internal condenser tubes 150, a surface area of the internal condenser tube 150 may be increased, thereby facilitating the contact between the cooling liquid gas and the internal condenser tube 150, so as to improve the condensation rate of the cooling liquid gas, thereby shortening the working medium circulation time of the fluid immersion cooling system 100 and improving the cooling efficiency of the fluid immersion cooling system 100.

Figure 9:
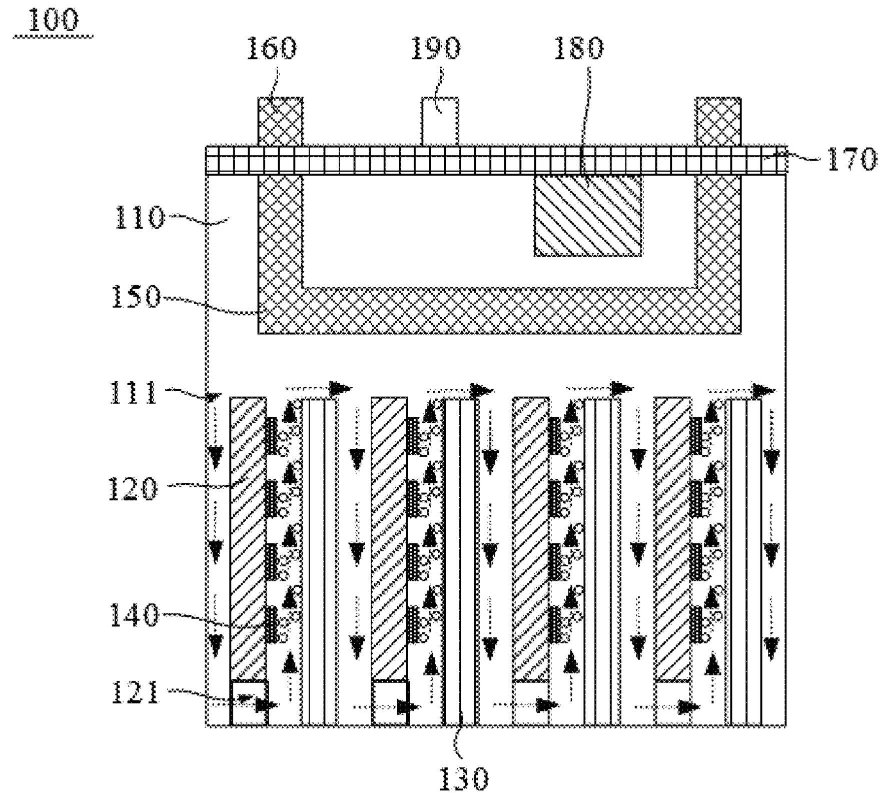
FIG. 9 is another structural schematic diagram of a fluid immersion cooling system provided by an embodiment of the present application.
Figure 10:
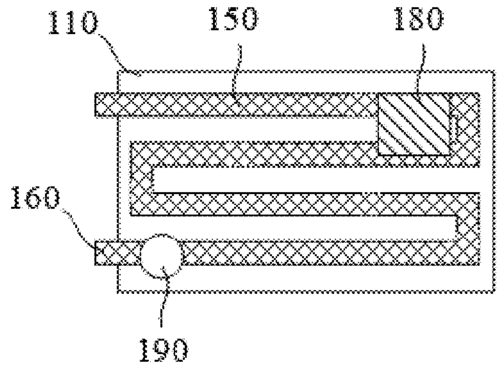
FIG. 10 is a second structural schematic diagram from another perspective of a fluid immersion cooling system provided by an embodiment of the present application.

As another implementation, referring to FIG. 9 and FIG. 10, there is one internal condenser tubes 150, and in this case, the internal condenser tube 150 may be a continuously bent tube. By providing the above-mentioned internal condenser tube 150, the surface area of the internal condenser tube 150 may be increased, thereby facilitating the contact between the cooling liquid gas and the internal condenser tube 150, so as to improve the condensation rate of the cooling liquid gas, thereby shortening the working medium circulation time of the fluid immersion cooling system 100 and improving the cooling efficiency of the fluid immersion cooling system 100.

As an implementation, referring to FIG. 1 and FIG. 8 to FIG. 10, the fluid immersion cooling system 100 further includes a drying member 180. The drying member 180 is located in the accommodating cavity 111, and located on an inner wall of the top of the housing 110, and is arranged close to the internal condenser tube 150. The drying member 180 is configured to absorb water vapor in the accommodating cavity 111 and prevent the circuit board 120 from being short-circuited due to water.

Specifically, the drying member 180 may include a drying box and a drying agent located in the drying box. The drying agent may include, but is not limited to, a silica gel drying agent or an activated carbon drying agent. The embodiments of the present application do not limit the type of the drying agent, and are not limited to the above-mentioned examples.

In the following, an example that the drying agent is the silica gel drying agent, is taken to explain.

As an implementation, referring to FIG. 1 and FIG. 8 to FIG. 10, the fluid immersion cooling system 100 further includes a vacuum plug 190. The vacuum plug 190 is provided on the housing 110 and communicates with the accommodating cavity 111, and is configured for injecting a cooling liquid or emptying a fluorinated liquid, and may also be configured for connecting a vacuum pump (not shown in the figures) to vacuumize the accommodating cavity 111. The vacuum plug 190 may be a metal vacuum plug. When the cooling liquid is the fluorinated liquid, the latent heat of vaporization of the fluorinated liquid is low, and the vacuum pump may be an oil-free vacuum pump.

It should be understood that, when the housing 110 is provided with the sealing member 170, on the one hand, the housing 110 includes an upper housing and a lower housing. All the circuit boards 120, the chips and the partitions 130 are provided in the lower housing, and all the internal condenser tube 150, the vacuum plug 190 and the drying member 180 are provided in the upper housing. On the other hand, the sealing member 170 may be located at the top of the housing 110 and is configured for sealing the accommodating cavity 111. The sealing member 170 may be a sealing washer, and may also be a sealing flange. The sealing member 170 may be attached to and detached from the housing 110 through a threaded connection.

It should be noted that, when the sealing member 170 is located in the housing 110, referring to FIG. 1, the sealing member 170 may have a through hole for the cooling liquid gas to flow, so that the cooling liquid gas contacts the internal condenser tube 150 through the through hole, thereby implementing condensation of the cooling liquid gas. When the sealing member 170 is located at the top of the housing 110, referring to FIG. 9, the sealing member 170 is located at an edge of the housing 110 and is configured for closing the housing 110, without providing the through hole for the cooling liquid gas to flow.

In this case, a cooling liquid filling process of the fluid immersion cooling system 100 is as follows:

in some embodiments, the upper housing is disassembled, and a cooling liquid is injected into a cavity of the lower housing, and a height of a liquid level of the cooling liquid is slightly greater than a height of the circuit board 120. Then, the upper housing is installed, the sealing member 170 is installed, and finally, a vacuum pump is connected through the vacuum plug 190 to vacuumize the housing 110, thereby preventing air which cannot be condensed from existing in the accommodating cavity 111.

In other embodiments, the cooling liquid is injected through the vacuum plug 190, the height of the liquid level of the cooling liquid is slightly greater than the height of the circuit board 120, the sealing member 170 is installed, and finally, the vacuum pump is connected through the vacuum plug 190 to vacuumize the housing 110. In this case, the housing 110 may be integrally formed.

It should be noted that, during the vacuumizing process, the user may determine the pressure in the housing 110 through a vacuum gauge, and may also set a relatively long vacuumizing time to reduce a possibility of air existing in the accommodating cavity 111. For example, after confirming the vacuum through the vacuum gauge, the vacuumizing operation is continued for 5 minutes.

In the description of the embodiments of the present application, it should be understood that, unless otherwise specified and limited, the terms "install", "connect", and "connection" should be broadly understood, for example, it may be fixedly connected, may also be indirectly connected through an intermediate medium, may be a structural communication between two elements or interaction relationship between two elements. For those skilled in the art, the specific meanings of the above terms in the present application may be understood according to the specific circumstances.

The orientation or position relationship indicated by the terms "upper", "lower", "front", "back", "vertical", "horizontal", "top", "bottom", "inner", "outer" and the like is based on the orientation or position relationship shown in the accompanying drawings, which is only for the convenience of describing the present application and simplifying the description, and does not indicate or imply that the device or element referred to must have a specific orientation, and be constructed and operated in a specific orientation, and therefore cannot be understood as a limitation to the present application. In the description of the present application, "a plurality of" means two or more, unless precisely specified otherwise.

The terms "first", "second", "third", "fourth" and the like in the specification, claims and the above accompanying drawings of the present application are used to distinguish similar objects, and are not necessarily used to describe a specific sequence or order. It should be understood that such data may be interchanged under appropriate circumstances, so that the embodiments of the present application described herein may be implemented in other sequences than those illustrated or described herein. Further, the terms "include" and "have", and any variations thereof, are intended to cover a non-exclusive inclusion, for example, a process, method, system, product, or apparatus that includes a series of steps or units are not necessarily limited to those steps or units that are expressly listed, but may include other steps or units that are not expressly listed or inherent to such process, method, product, or apparatus.

Finally, it should be noted that, the foregoing embodiments are merely intended for illustrating the technical solutions of the present application, but not intended to limit it. Although the present application is described in detail with reference to the foregoing embodiments, it should be understood by those skilled in the art that, the technical solutions described in the foregoing embodiments may still be modified, or sub-structural or whole-structural technical features thereof may be replaced by equivalents. However, these modifications or replacements do not make the essence of the corresponding technical solutions depart from the scope of the technical solutions of the embodiments of the present application.

What is claimed is:

1. A fluid immersion cooling system, comprising a housing, a circuit board and a partition, wherein the housing has an accommodating cavity, and the accommodating cavity is configured for accommodating cooling liquid; there are a plurality of circuit boards, the plurality of circuit boards are spaced apart from each other in the accommodating cavity and are all located at a bottom of the housing, and a side of the circuit board close to the bottom of the housing is provided with a guide hole; there are a plurality of partitions, and one partition is located between two adjacent circuit boards and spaced apart from the corresponding circuit board;

areas between the partitions and the circuit boards, top areas of the partitions and the guide holes together form a continuously bent flow channel for the cooling liquid to flow.

2. The fluid immersion cooling system according to claim 1, wherein a chip is provided on the circuit board, a surface on which the chip is provided on the circuit board is a front surface, a surface on which the chip is not provided is a back surface, and a distance between the front surface and a corresponding partition is greater than a distance between the back surface and a corresponding partition.

3. The fluid immersion cooling system according to claim 2, wherein the distance between the front surface and the corresponding partition is A, the distance between the back surface and the corresponding partition is B, and a relationship between A and B is:

$$\frac{A}{B} \geq 4,\ A \geq 4 \text{ mm}.$$

4. The fluid immersion cooling system according to claim 3, wherein a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

5. The fluid immersion cooling system according to claim 3, wherein in a direction perpendicular to an extending direction of the circuit board, an orthographic projection of the partition on the housing at least covers an orthographic projection of the circuit board on the housing.

6. The fluid immersion cooling system according to claim 3, wherein there are a plurality of guide holes, and the plurality of guide holes are spaced apart from each other in an array on the circuit board.

7. The fluid immersion cooling system according to claim 2, wherein one circuit board is provided with a plurality of chips, and the plurality of chips are spaced apart from each other in an array on the circuit board;

the fluid immersion cooling system further comprises a heat conducting member, and there are a plurality of heat conducting members; the plurality of heat conducting members correspond to the plurality of chips and are provided on a side of the corresponding chips away from the circuit board.

8. The fluid immersion cooling system according to claim 7, wherein the heat conducting member comprises a metal member or graphite, and the heat conducting member at least covers a part of the corresponding chip.

9. The fluid immersion cooling system according to claim 8, wherein a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

10. The fluid immersion cooling system according to claim 8, wherein in a direction perpendicular to an extending direction of the circuit board, an orthographic projection of the partition on the housing at least covers an orthographic projection of the circuit board on the housing.

11. The fluid immersion cooling system according to claim 7, wherein a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

12. The fluid immersion cooling system according to claim 7, wherein in a direction perpendicular to an extending direction of the circuit board, an orthographic projection of the partition on the housing at least covers an orthographic projection of the circuit board on the housing.

13. The fluid immersion cooling system according to claim 2, wherein a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

14. The fluid immersion cooling system according to claim 2, wherein in a direction perpendicular to an extending direction of the circuit board, an orthographic projection of the partition on the housing at least covers an orthographic projection of the circuit board on the housing.

15. The fluid immersion cooling system according to claim 2, wherein there are a plurality of guide holes, and the plurality of guide holes are spaced apart from each other in an array on the circuit board.

16. The fluid immersion cooling system according to claim 1, wherein a side of the partition away from the bottom of the housing is spaced apart from an inner wall of a top of the housing;

a side of the circuit board away from the bottom of the housing is spaced apart from the inner wall of the top of the housing, or, the side of the circuit board away from the bottom of the housing is closely arranged with the inner wall of the top of the housing.

17. The fluid immersion cooling system according to claim 1, wherein in a direction perpendicular to an extending direction of the circuit board, an orthographic projection of the partition on the housing at least covers an orthographic projection of the circuit board on the housing.

18. The fluid immersion cooling system according to claim 1, wherein there are a plurality of guide holes, and the plurality of guide holes are spaced apart from each other in an array on the circuit board.

19. The fluid immersion cooling system according to claim 1, further comprising an internal condenser tube and an external condenser tube which are communicated with each other; the internal condenser tube is located in the accommodating cavity and is arranged close to a top of the housing; the external condenser tube is located outside the housing and is communicated with the internal condenser tube.

20. The fluid immersion cooling system according to claim 19, wherein there are a plurality of internal condenser tubes, the plurality of internal condenser tubes are spaced apart from each other in parallel, and the plurality of internal condenser tubes are all in communication with the external condenser tube.

* * * * *